United States Patent
Hasebe et al.

[11] Patent Number: 6,156,121
[45] Date of Patent: Dec. 5, 2000

[54] WAFER BOAT AND FILM FORMATION METHOD

[75] Inventors: Kazuhide Hasebe, Shirane-machi; Atsumi Ito, Shikishima-cho; Kenji Tago, Kofu, all of Japan

[73] Assignee: Tokyo Electron Limited, Japan

[21] Appl. No.: 08/991,208

[22] Filed: Dec. 16, 1997

[30] Foreign Application Priority Data

Dec. 19, 1996 [JP] Japan .................................. 8-354308
Dec. 26, 1996 [JP] Japan .................................. 8-356858

[51] Int. Cl.$^7$ .................................................. B05C 13/00
[52] U.S. Cl. .......................... 118/500; 118/723; 219/390; 219/400; 211/41.14; 211/41.18
[58] Field of Search ..................................... 257/448, 507, 257/618, 731; 118/500, 723; 219/390, 400; 211/41.14, 41.18

[56] References Cited

U.S. PATENT DOCUMENTS

| | | | |
|---|---|---|---|
| 5,109,264 | 4/1992 | Ohdate | 357/40 |
| 5,217,340 | 6/1993 | Harada et al. | 414/172 |
| 5,622,639 | 4/1997 | Kitayama et al. | 219/390 |
| 5,662,469 | 9/1997 | Okase et al. | 432/6 |
| 5,752,609 | 5/1998 | Kato et al. | 211/41.18 |

*Primary Examiner*—David Nelms
*Assistant Examiner*—Reneé R. Berry
*Attorney, Agent, or Firm*—Smith, Gambrell & Russell, LLP

[57] ABSTRACT

A wafer boat that supports a plurality of semiconductor wafers at a predetermined pitch, which are to be processed by a vertical thermal processing furnace, comprises a plurality of support columns; wafer support grooves formed in the support columns for supporting the peripheral edges of the wafers; and a film thickness equalization plate that is substantially the same size as the wafers. or is larger than the wafers, and is provided in wafer support grooves that are adjacent to one another in the vertical direction. This configuration ensures the same type of film is formed on the surface facing the surface of the wafer, achieving uniformity of the thus-formed film thickness.

8 Claims, 15 Drawing Sheets

WAFER BOAT AND FILM FORMATION METHOD

BACKGROUND OF THE INVENTION

1. Field of the Invention

The present invention relates to a wafer boat for holding a plurality of semiconductor wafers and for accommodating the same in a vertical thermal treatment furnace. It also relates to a film formation method.

2. Description of Related Art

In order to form a semiconductor integrated circuit, processes of forming a film on a semiconductor wafer then etching the thus-formed film in a predetermined circuit pattern are generally repeated a plurality of times. A batch-type vertical thermal treatment furnace is often used for this film formation process because it is capable of processing a large number of wafers, such as 50 to 150 wafers, at a time. To maintain the electrical characteristics of the completed semiconductor integrated circuits as products, the uniformity of each film over the entire wafer surface must be kept high.

With this type of semiconductor integrated circuit, a large number of components such as transistors, resistors, and capacitors are fabricated smaller and at higher levels of integration, and there have recently been requests for a further increase in miniaturization in such components to answer demands for even higher densities and higher levels of integration.

If capacitors are taken as an example, the surface area thereof decreases as the degree of integration increases, so that the capacitance thereof also decreases. This means that the thickness of the capacitative insulating film of the capacitor, which acts as the distance between the terminals thereof must be made thinner, or a capacitative insulating film with a high dielectric constant must be used, to compensate for the deficiency in surface area and guarantee a predetermined capacitance.

In the prior art, a two-layer structure such as one of silicon nitride ($Si_3N_4$) and silicon oxide ($SiO_2$) is used as the capacitative insulating film of such a capacitor, but the dielectric constant E of this type of capacitative insulating film is on the order of 3.8 to 4.0. If recent design rules for devices are considered, the thickness of the capacitative insulating film has reached a physical limit for ensuring the insulating capabilities, such as approximately 5 to 8 nm. This means that a capacitative insulating film with an even higher dielectric constant is required, to ensure a predetermined capacitance from a smaller surface area.

In these circumstances, tantalum oxide ($Ta_2O_5$) film has recently attracted attention as a novel capacitative insulating film that satisfies the above requirements. The dielectric constant of this tantalum oxide film is extremely high, on the order of 27, which is seven times the dielectric constant of the above described two-layer capacitative insulating film, so that this material is attracting attention as a superior capacitative insulating film.

When this tantalum oxide film is used as a capacitative insulating film, the surface of a lower electrode, which is formed of polysilicon that has been doped with an impurity, is covered by a silicon nitride film that is created by rapid thermal nitridation (RTN) processing, and then the tantalum oxide film is formed. The tantalum oxide film is annealed in an oxygenated atmosphere after it is formed, so the nitride film is provided to prevent oxidation of the polysilicon lower electrode during that annealing.

When such a tantalum oxide film is to be formed for a device that has even higher levels of density and integration, extremely highly accurate control over the film thickness is required, as described above. At the same time, the uniformity of the film thickness within each surface is also required to be maintained even higher. The construction of the wafer boat has a large effect on this uniformity of the film thickness under batch processing conditions.

A wafer boat that is generally known in the art is shown by way of example in FIGS. 11 to 13. In the prior-art wafer boat shown in these figures, annular holder plates are fixed to the upper and lower ends of a number of support columns 2, such as three such columns, made of quartz and a large number of wafer support grooves 6 are formed at a predetermined pitch along the inner sides of the support columns 2, in the longitudinal direction thereof. Wafers W are mounted on and held by the wafer support grooves 6, the entire wafer boat is inserted in this state into a vertical thermal processing furnace, and a predetermined thermal processing is performed.

A wafer boat of the configuration shown in FIGS. 14 and 15 has also been proposed. This wafer boat has a structure that differs from that of the above described wafer boat where the wafers W are supported directly by the support columns 2, in that quartz mounting stands 8 are supported by groove portions 12 of the three support columns 2, and a large number of these annular mounting stands 8 are provided at a predetermined pitch. Gas flow apertures 10 of approximately the same size as the wafers W are provided in the mounting stands 8, and the mounting stands 8 themselves are formed to be annular.

A plurality of hook-shaped support protrusions 14, such as three support protrusions 14, is provided on an inner peripheral edge of the upper surface of each of the mounting stands 8 in such a manner as to extend slightly inward in the radial direction, and the wafers W are supported thereon with the lower peripheral edges thereof in contact with these hook-shaped support protrusions 14.

This prior-art wafer boat construction causes no problems if the requirements for the levels of integration and density are not too high, as in the prior art. However, if control over the film thickness in nanometer units is required, as it is with current demands for even higher levels of integration and density, this construction becomes insufficient.

For example, the processing temperature is generally set to a high temperature region in which gaseous-phase reactions occur, such as approximately 350 to 480° C. for the formation of a tantalum oxide film or approximately 600 to 650° C. for the formation of a polysilicon film, because the resultant film-formation speed is so high. However, with such gaseous-phase reactions, there is a tendency for the thickness of the thus-formed film to increase slightly from the central portion of each wafer towards the peripheral portion thereof. For that reason, the processing temperature is set to a level that is less than each of the above temperature ranges, so that there are no gaseous-phase reactions and the gases cause a film to adhere on the wafer surface by surface reactions, to satisfy the demand for uniformity of film thickness within each wafer surface.

However, a problem arises during such surface reactions in that the amount of film formed on the upper surface of the wafer which is being subjected to the film-formation process is affected by the type of film or the state of the lower surface of the wafer positioned immediately thereabove, so that it becomes difficult to maintain high levels of uniformity of film thickness within each surface and between different surfaces.

In general, as shown in FIG. 11, a plurality of dummy wafers W1 are always placed at each of the upper and lower ends of the wafer boat, and one monitor wafer W2 for monitoring factors such as the film thickness during the film formation is disposed on the inner side (towards the center of the wafer boat) of each of these groups of dummy wafers W1. A large number of product wafers W are disposed between these monitor wafers W2.

In such a case, since the dummy wafers W1 are always in position during a plurality of repetitions of the film-formation process, the same type of film forms on the upper and lower surfaces thereof. In contrast, a bare wafer is used as each monitor wafer W2, so a state occurs in which a natural oxide film ($SiO_2$) forms irregularly on the monocrystalline silicon of the lower surface thereof. In addition, it does not always happen that all of the product wafers W accommodated in the wafer boat have experienced the same processing steps; it could happen that wafers W that have experienced different processing steps are accommodated in the wafer boat. In such a case, various different film types could form on the lower surfaces of the wafers W. In addition, if nitriding by RTN processing is performed on the polysilicon of the lower electrode as preprocessing before the formation of a tantalum oxide film, for example, it could happen that an insufficiency of the nitriding gases could leave the polysilicon exposed at the central portion of the lower surface of the wafer, so that only the edges thereof are nitrided.

Thus, when films are formed by surface reactions, the film formation on the upper surface of each wafer is affected by the state of the lower surface of the wafer positioned immediately thereabove, making it extremely difficult to obtain a high level of accuracy in the uniformity of the film thickness between surfaces and within each surface.

SUMMARY OF THE INVENTION

The present invention was devised to solve the above described problems in the prior art. An object of this invention is to provide a wafer boat that is capable of increasing the uniformity of the thickness of a film formed on the surfaces of objects to be processed, such as wafers, both within each surface and between surface.

In order to achieve the above object, the present invention relates to a wafer boat for supporting a plurality of semiconductor wafers parallel and at a certain spacing, to be subjected to a thermal treatment in a vertical thermal treatment furnace, wherein the wafer boat comprises: a plurality of parallel support columns; wafer support means formed at intervals in the longitudinal direction of said support columns at positions along said support columns, for supporting peripheral portions of the wafers; and a film thickness equalization plate formed to be at least approximately the same size as the wafers and positioned between two of the wafer support means that are adjacent in the longitudinal direction of the support columns.

The wafer support means may be configured of wafer support grooves formed in the support columns.

The film thickness equalization plate may be supported by the support columns and the wafer support means may be provided on the film thickness equalization plate.

The present invention also relates to a film-formation method for forming a film on a surface of a semiconductor wafer, wherein said method comprises a step of washing the surface of said wafer to remove organic substances from said surface, before said wafer is transferred in a wafer boat and before a film is formed on said wafer.

DESCRIPTION OF THE PREFERRED EMBODIMENTS

Embodiments of the present invention will be described below with reference to the accompanying drawings.

Figure 1:
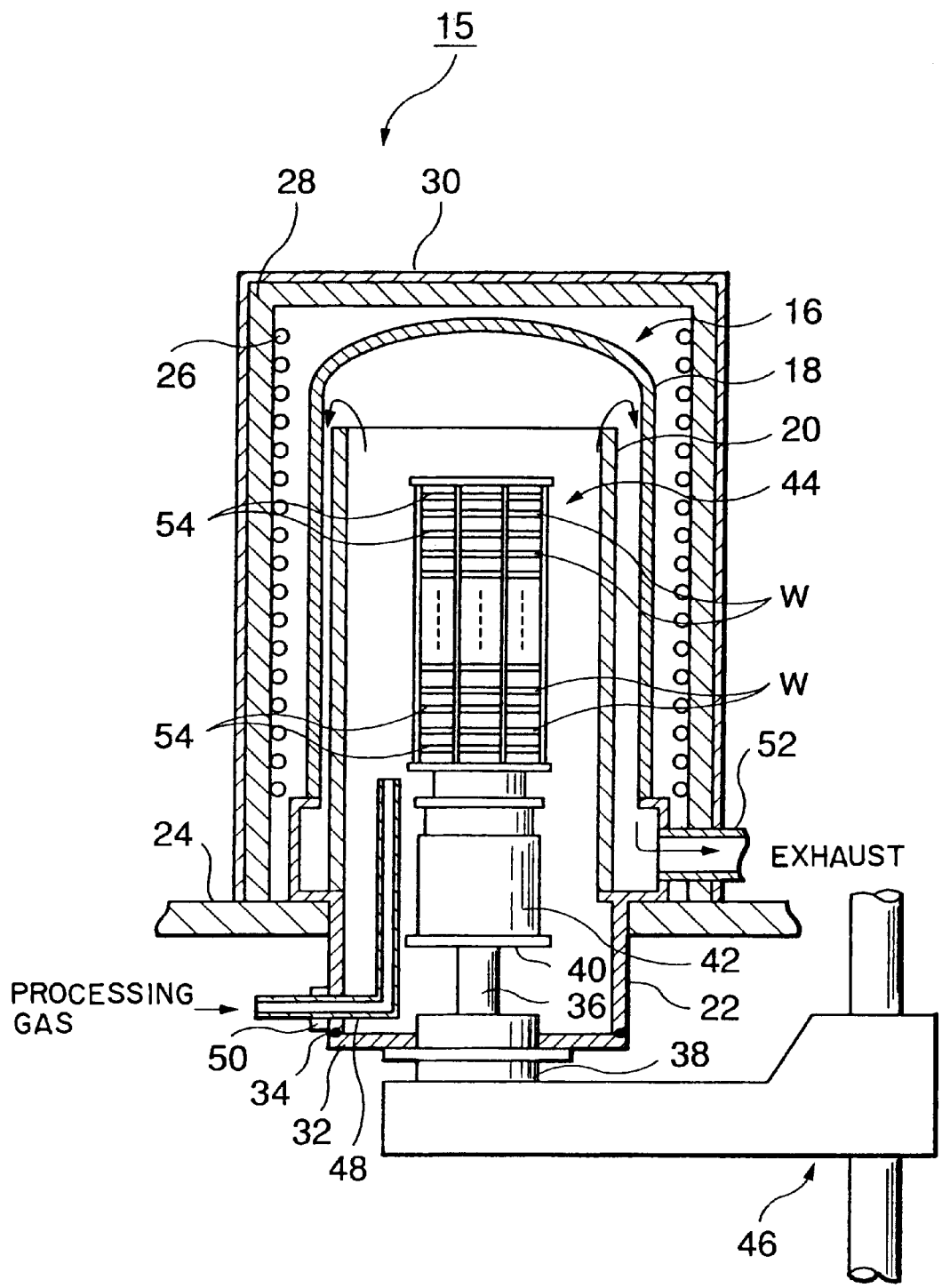
FIG. 1 is a vertical cross-sectional view through a vertical thermal processing furnace that accommodates a wafer boat in accordance with the present invention.

A vertical thermal processing furnace for accommodating a wafer boat is shown in FIG. 1. In this figure, a vertical thermal processing furnace 15 has a circular cylindrical reaction vessel 16 with a longitudinal direction thereof disposed substantially vertically, and this reaction vessel 16 has a double-wall structure formed of an outer tube 18 of a thermally resistant material such as quartz and an inner tube 20 which is disposed concentric therewith and is also made of quartz.

Lower edge portions of the outer tube 18 and inner tube 20 are supported by a manifold 22 made of a material such as stainless steel, and this manifold 22 is fixed to a base plate 24.

A circular cylindrical heater 26 such as a resistive heating element is disposed in such a manner as to surround the reaction vessel 16, to form a thermal processing portion. An insulating layer 28 of, for example, silica blocks is formed on the outer side of the heater 26 in order to retain the heat of this thermal processing portion, and a circular cylindrical outer casing 30 of a material such as stainless steel is provided therearound in order to protect the entire apparatus.

A circular plate-shaped cap 32 formed of a material such as stainless steel is attached in an opening portion at the lower edge of the manifold 22 with an O-ring 34 of a resilient material therebetween, to form a hermetic seal. A rotational shaft 36, which is capable of rotating in a state in which it is sealing by a magnetic fluid, is inserted through an approximately central portion of the cap 32. A lower end of this rotational shaft 36 is connected to a rotational mechanism 38 and an upper end thereof is fixed to a turntable 40 made of a material such as stainless steel.

An insulating tube 42 of quartz is disposed on top of the turntable 40 and a wafer boat 44 in accordance with this invention, which is of quartz or the like, is mounted on top of the insulating tube 42. A large number of semiconductor wafers, such as 50 to 150 wafers, are accommodated within this wafer boat 44 at a pitch of a predetermined spacing, such as approximately 10 mm. The configuration is such that the wafer boat 44, the insulating tube 42, the turntable 40, and the cap 32 are loaded as a single unit into the reaction vessel 16 by an elevator mechanism such as a wafer elevator 46, and are unloaded therefrom in a similar manner.

Below the manifold 22 is disposed a processing gas introduction pipe 48 of a material such as quartz that is bent into an L-shape directed upwards, that is, in the direction of the wafer boat 44. It is sealed to the manifold 22 by a seal member 50 and is configured to introduce a processing gas for film formation, such as penta-ethoxy tantalum, oxygen, or a carrier gas into the inner tube 20 while controlling the flow-rate thereof.

An exhaust pipe 52 that is made of a material such as stainless steel and is connected to a vacuum pump (not shown in the figure) is connected to a lower side surface of the manifold 22 in such a manner that gas that has been used in the processing and then flows downward in a space between the inner tube 20 and the outer tube 18 is exhausted thereby out of the vessel.

The description now turns to the wafer boat 44 of the present invention, which is accommodated within the vertical thermal processing furnace 15 of the above configuration, with reference to FIGS. 2 to 5.

Figure 2:
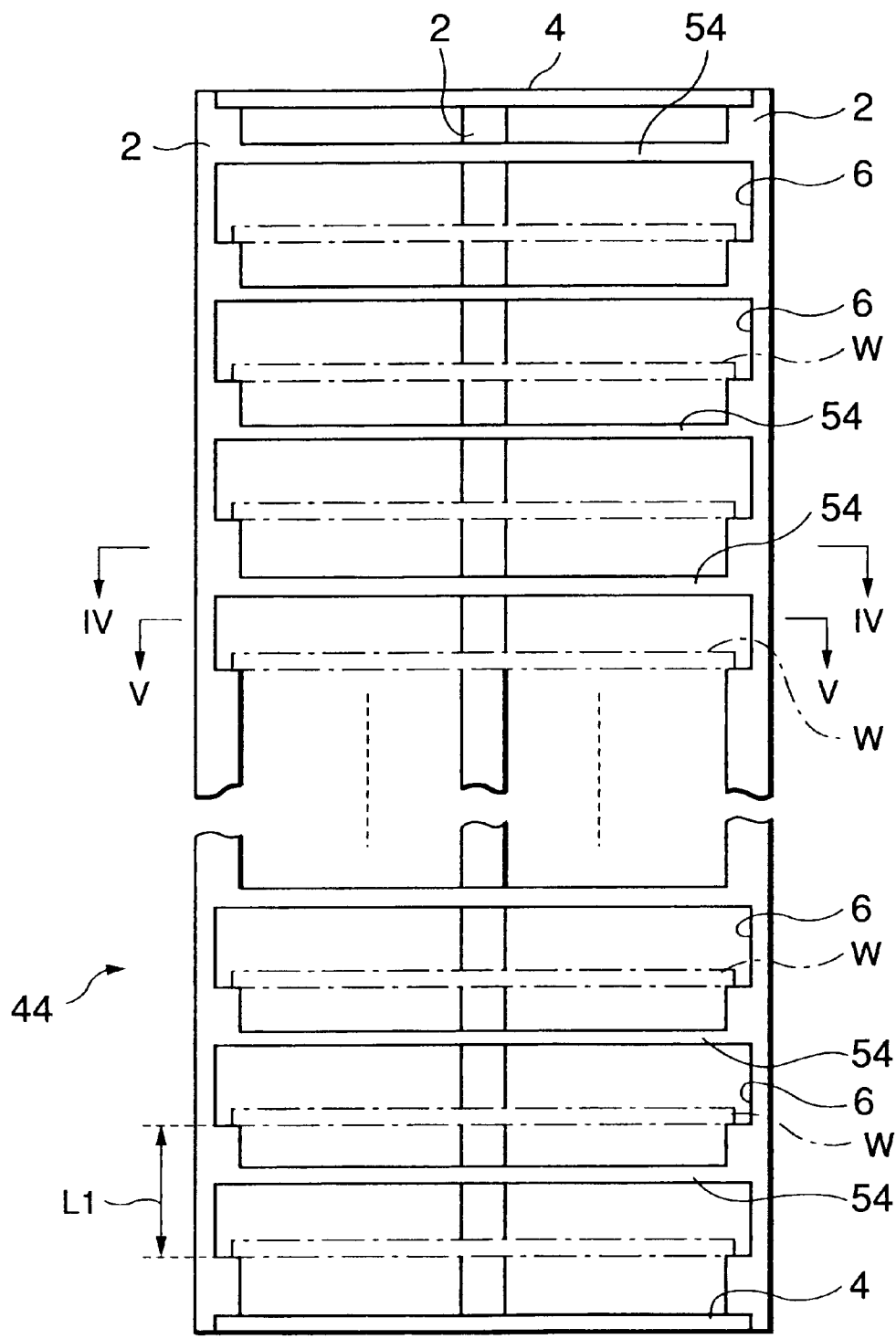
FIG. 2 is a partial enlarged front view of a first embodiment of a wafer boat in accordance with the present invention.
Figure 3:
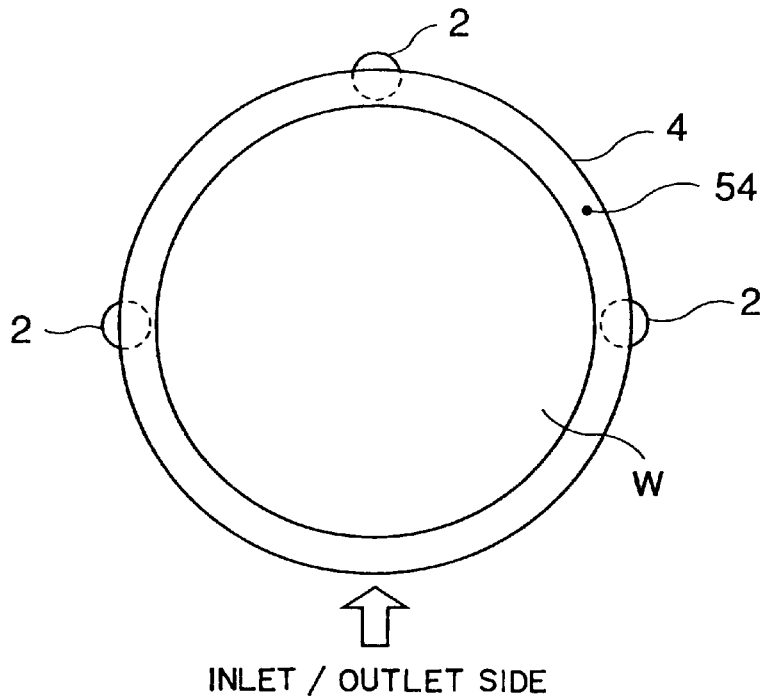
FIG. 3 is a plan view of the wafer boat of FIG. 2.
Figure 4:
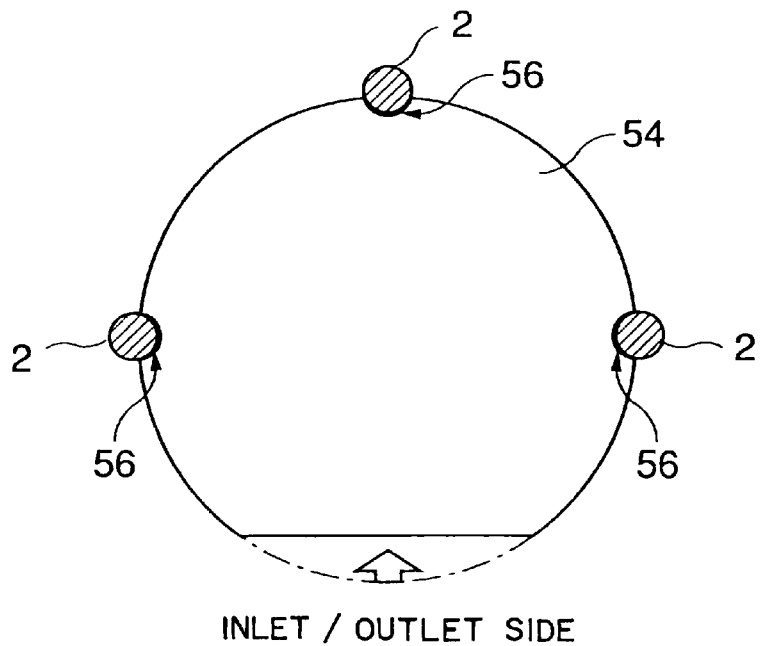
FIG. 4 is a sectional view taken in the direction of the arrows IV—IV in FIG. 2.

The wafer boat 44 is formed in its entirety of a thermally resistant material such as quartz, as mentioned previously. More specifically, the wafer boat 44 has, for example, three support columns 2 disposed along a semi-circular arc, as shown in FIGS. 3 and 4, and annular holder plates 4 are fixed to the upper and lower ends thereof, as shown in FIG. 2. Note that the holder plate 4 may have a circular shape instead of an annular shape. The three support columns 2 are disposed at a predetermined spacing along an approximately semicircular arc of the holder plate 4, and the semicircular side on the opposites sides thereof forms an inlet/outlet side for conveying the wafers into and out therefrom. Although the three support columns 2 are disposed at approximately equal spacing on an approximately semicircular arc in the example shown in the figures, the disposition and spacing of the support columns 2 are not limited thereto. In addition, the number of support columns is, of course, not limited to three.

A large number of wafer support grooves 6, which are cut as concave shapes in a cross-sectionally semicircular form, are provided at a predetermined pitch L1 along the longitudinal direction of the support columns 2, on the inner side of each of the support columns 2. This pitch L1 is set to be on the order of 10 mm for 8-inch wafers, for example, and a total of between 50 and 150 wafer support grooves 6 are provided in each of the support columns 2.

Figure 5:
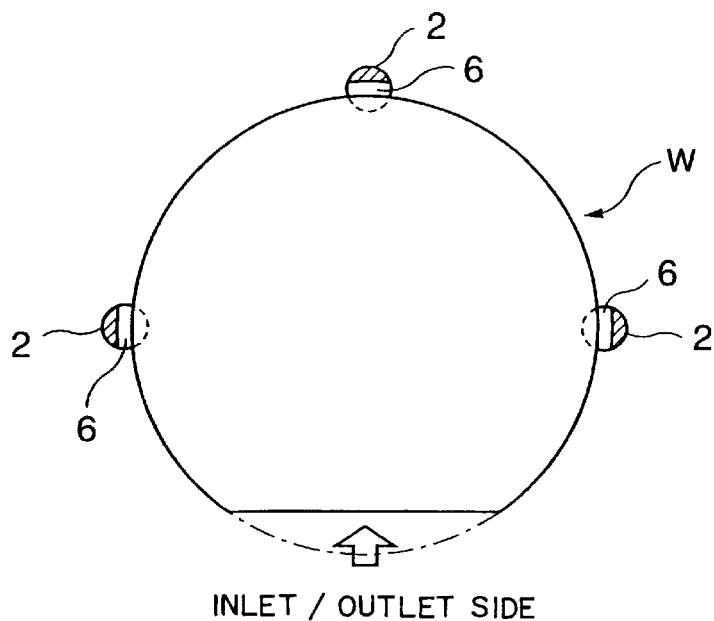
FIG. 5 is a cross-sectional view taken in the direction of the arrows V—V in FIG. 2.

The peripheral edge of the rear surface, that is, the under surface, of each of wafers W is held in contact with one of these wafer support grooves 6, so that each wafer W is held thereby at three points, as shown in FIG. 5.

A circular film thickness equalization plate 54 that is a characteristic element of this invention is fixed integrally by means such as fusing to the support columns 2, as shown in FIG. 4, in such a manner as to link together the three support columns 2 and to be positioned between wafer support grooves 6 that are adjacent to each other in the vertical direction. This film thickness equalization plate 54 is made of a material such as quartz and is formed to be approximately the same size as the wafers W, or to be slightly larger than the wafers W. Note that each film thickness equalization plate 54 and wafer W has a shape in which portions of the peripheral edge thereof are cut away, as shown in FIGS. 4 and 5, but the peripheral cutouts could equally well be omitted as shown by imaginary line in these figures.

Therefore, when wafers W have been loaded into the wafer boat 44, the wafers W and film thickness equalization plates 54 are positioned alternately in the vertical direction and the upper surface of a wafer W always faces the lower surface of a film thickness equalization plate 54, as shown in FIG. 2. In the example shown in these figures, each film thickness equalization plate 54 is positioned at approximately the center between wafer support grooves 6 that are adjacent in the vertical direction. However, it could equally well be displaced toward either of the wafer support grooves 6 positioned above or below, and the pitch L1 is not limited to the value stated above.

Figure 12:
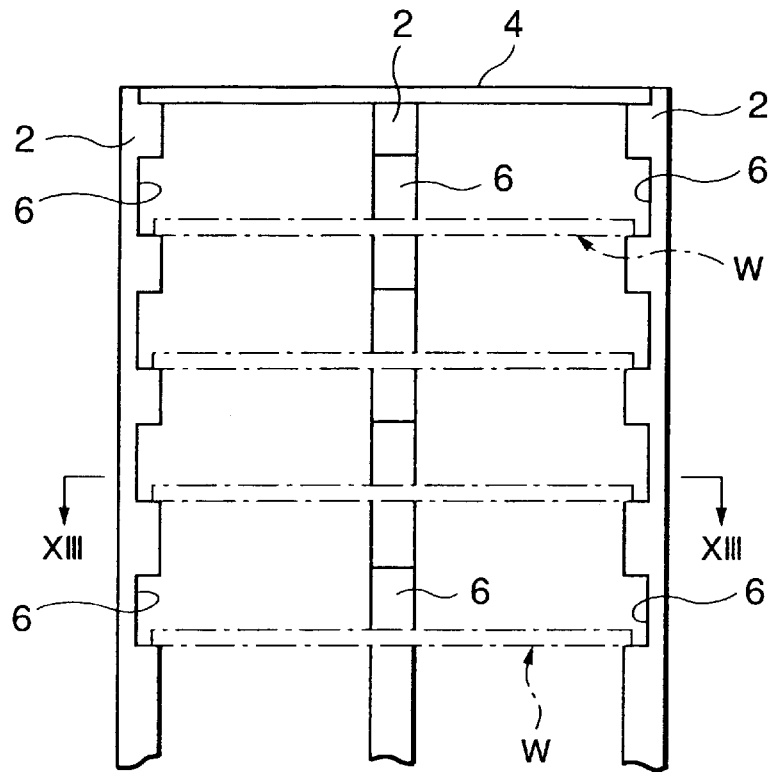
FIG. 12 is a partial enlarged view of an example of a prior-art wafer boat.
Figure 13:
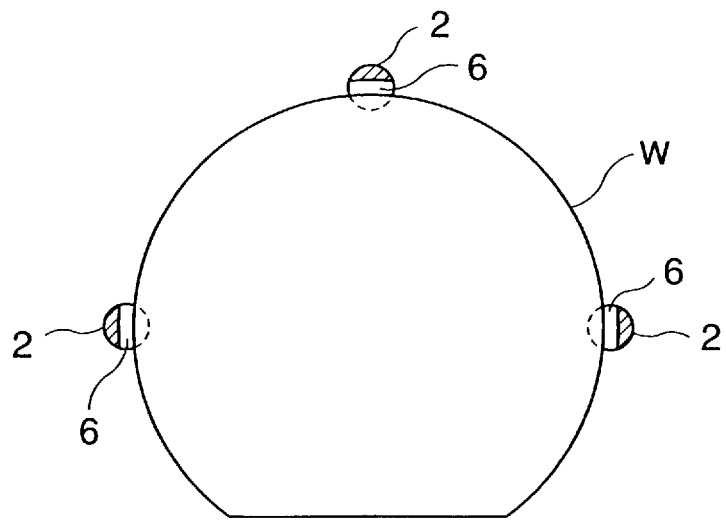
FIG. 13 is a cross-sectional view taken in the direction of the arrows XIII—XIII in FIG. 12.

The thus configured film thickness equalization plate 54 is cut as a thin disc from a column of quartz and can be used to modify the wafer boat of this invention in a simple manner, by being attached to the support columns 2 of the prior-art wafer boat shown in FIG. 12.

The operation of the thus configured wafer boat will now be described.

In this case, the description refers to the formation of a film of tantalum oxide ($Ta_2O_5$). First of all, a wafer boat 44 in which is loaded a large number of unprocessed wafers W is raised by the wafer elevator 46 from below the reaction vessel 16 and is accommodated in the reaction vessel 16, and the lower opening portion of the vessel is sealed by the cap 32. Note that dummy wafers and monitor wafers are also accommodated within the wafer boat. At the same time that the interior of the reaction vessel 16 has been evacuated down to below a predetermined pressure, the heater 26 is powered to heat the wafers W to a predetermined processing temperature at which a surface reaction occurs, such as to 400° C., and this temperature is maintained. A film-formation gas is introduced into the vessel at a controlled flow-rate from the processing gas introduction pipe 48 positioned below the wafer boat 44, and this gas flows between the wafers as it rises within the inner tube 20, causing the formation of a film thereon.

In this case, the film-formation process involves repeated use of the wafer boat 44 to form films of tantalum oxide. Therefore, a tantalum oxide film becomes attached over all the surfaces of the wafer boat 44, which of course means the surfaces of the support columns 2 as well as the upper and lower surfaces of each film thickness equalization plate 54, to form the same type of film thereon.

If such a wafer boat 44 is used and film-formation processing to form a tantalum oxide film is performed on the unprocessed wafers W as described above, the upper surface of each wafer W faces the lower surface of the film thickness equalization plate 54 immediately thereabove, and a tantalum oxide film, which is the same type of film, attaches to both surfaces, as described above. This means that the film-formation processing conditions experienced by each of the surfaces facing the wafers W, such as the film-formation speed and the incubation time (which will be described later) are substantially the same, and thus the uniformity of the film thickness can be maintained high between different wafer surfaces.

In addition, since the lower surface of each film thickness equalization plate 54 is covered by a tantalum oxide film and is thus homogeneous, the film thickness within the surface of each wafer can also be deposited in a uniform state.

Figure 6:
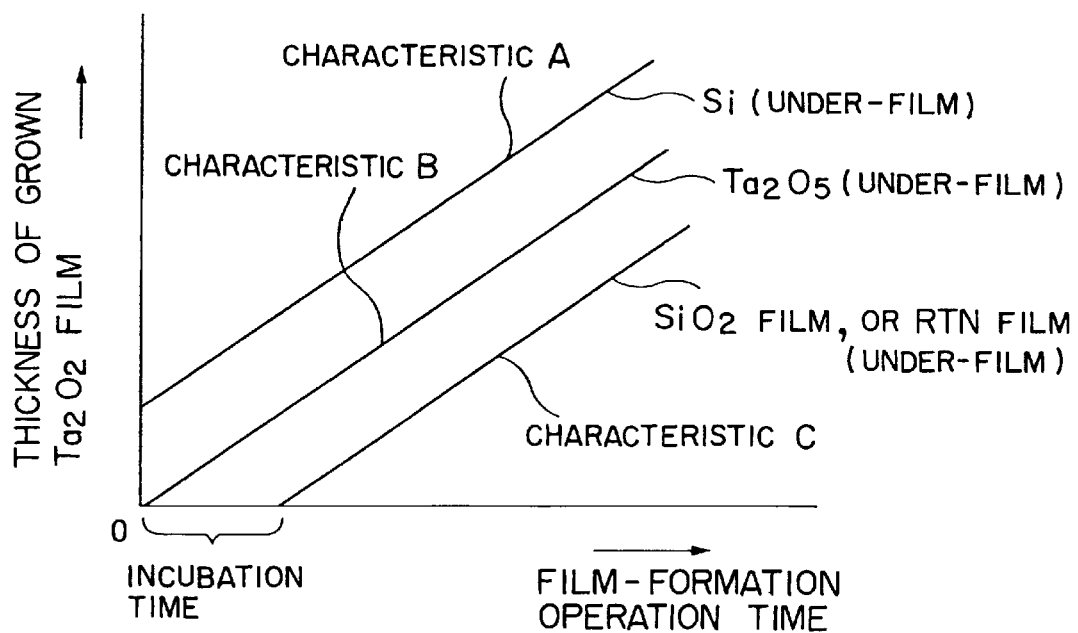
FIG. 6 is a graph showing the dependency of the film thickness of a tantalum oxide film to the under-film of the wafer.

The above point will now be discussed in more detail with reference to FIG. 6. This figure is a graph of the dependency of the amount of growth of a $Ta_2O_5$ film when $Ta_2O_5$ films are formed on wafer surfaces that have had various different under-films formed thereon. Note that the surface of each wafer opposite to this surface is not considered.

Characteristic A shows the film-formation state of a $Ta_2O_5$ film when the under-film on the wafer is silicon (comprising polysilicon), characteristic B shows the film-formation state of a $Ta_2O_5$ film when the under-film on the wafer is also $Ta_2O_5$, and characteristic C shows the film-formation state of a $Ta_2O_5$ film when the under-film on the wafer is an $SiO_2$ or an RTN film.

If a $Ta_2O_5$ film is formed for each wafer by a surface reaction, not a gaseous-phase reaction, the film-formation speed is substantially the same for each of characteristics A, B, and C. However, with characteristic A, the formed film is deposited in constant amounts in steps from immediately after the start of the film-formation operation; with characteristic B, the film formation proceeds from a state in which the film thickness is substantially zero immediately after the start of the film-formation operation; and with characteristic C, there is a fixed period of time (incubation time) during which the film is not deposited immediately after the start of the film-formation operation, and then the film formation starts. This incubation time is on the order of one minute, but it also depends on the film-formation conditions. This incubation time is thought to occur because time is required for forming the initial seeds for the film formation. It is therefore clear that the film thickness within a fixed time immediately after the start of the film-formation operation differs according to the film type of the under-film.

Now consider the differences in the above described film types on surfaces facing the wafers. When the film type of the surface facing the wafer, which is the target of the film formation, is a silicon film as illustrated by characteristic A, a large amount of the $Ta_2O_5$ film deposits on the silicon layer of the facing surface; Which has the result of consuming a large amount of processing gas in the space therebetween, reducing the gas density; which has the result of reducing the film-formation rate on the upper surface of the wafer that is the target of the film formation. In contrast thereto, when the film type of the surface facing the wafer, which is the target of the film formation, is an $SiO_2$ film or RTN film as illustrated by characteristic B, less of the $Ta_2O_5$ film is deposited on the facing surface than in the above example; which has the result of not reducing the consumption of processing gas in the space therebetween, thus keeping the gas density high; which has the result of increasing the film-formation rate on the upper surface of the wafer that is the target of the film formation.

Figure 7:
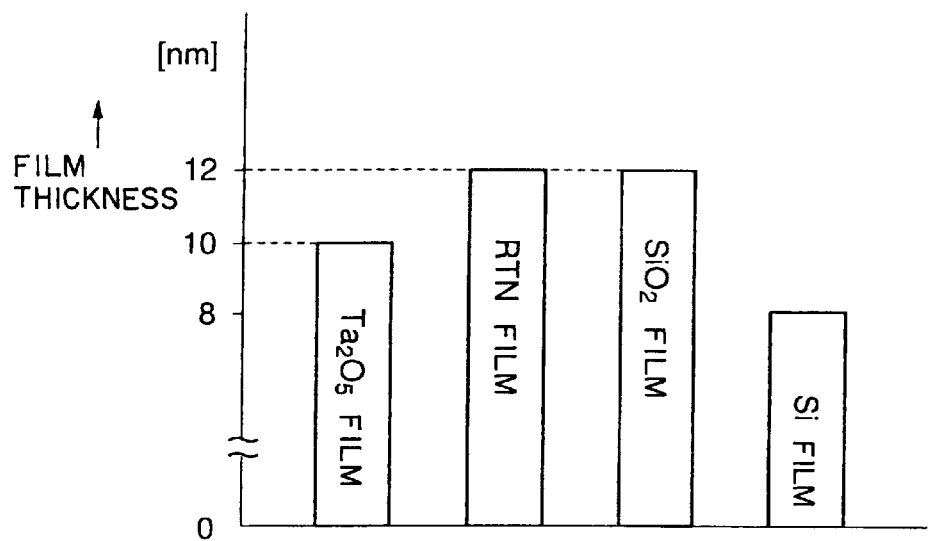
FIG. 7 is a graph showing the dependency of the film thickness of a tantalum oxide film with respect to the facing film type.

When experiments were done by varying the type of film on the facing surface to $Ta_2O_5$, an RTN film, an $SiO_2$ film, or an Si film, and film-formation processing was performed for just the time required for forming the same film of $Ta_2O_5$ on bare silicon wafers, results were obtained as shown in FIG. 7. Note that the target film thickness was 10 nm. It is clear from this figure that, when the film type on the facing surface was $Ta_2O_5$, a film thickness of approximately 10 nm was obtained. However, when the facing film type was an RTN film or an $SiO_2$ film, the film-formation gas was denser so that the thickness became approximately 12 nm. Conversely, when the facing film type was an Si film, the film-formation gas was lass dense and thus the film thickness was only approximately 8 nm.

Thus differing effects on the thickness of the film deposited on the upper surface of the wafer, which was the target of the film formation, were obtained depending on the film type of the facing surface. However, the wafer boat structure in accordance with this present invention, in which a film thickness equalization plate 54 is positioned between wafers, makes it possible to ensure that the film type on all the surfaces facing the wafers is the same, thus enabling a great deal of control over film thickness without causing non-uniformity to occur therein between different wafers.

In this case, it is possible to control the film thickness to a high level of accuracy during the above described formation of a $Ta_2O_5$ film by ensuing that the type of film that is to be formed is the same as the type of film on the surfaces facing the wafers (this operation can be done easily by using the wafer boat repeatedly for forming the same type of film).

Another embodiment of the wafer boat in accordance with the present invention will now be described with reference to FIGS. 8 to 10.

Figure 10:
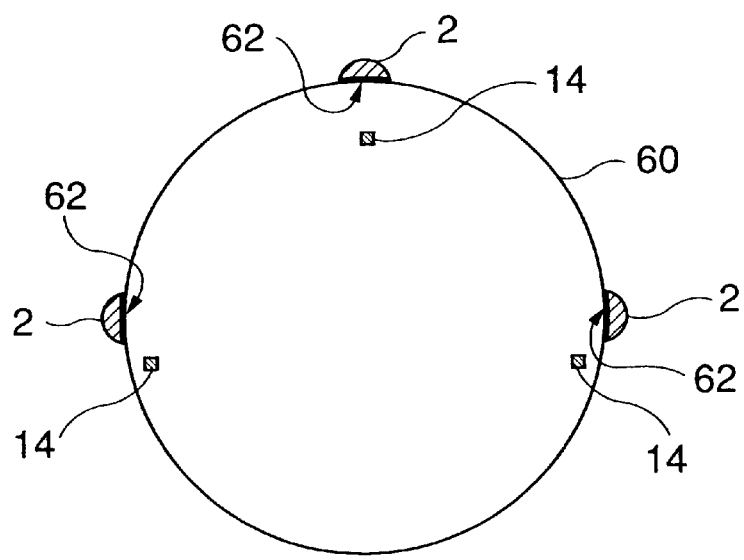
FIG. 10 is a cross-sectional view taken in the direction of the arrows X—X in FIG. 8.
Figure 11:
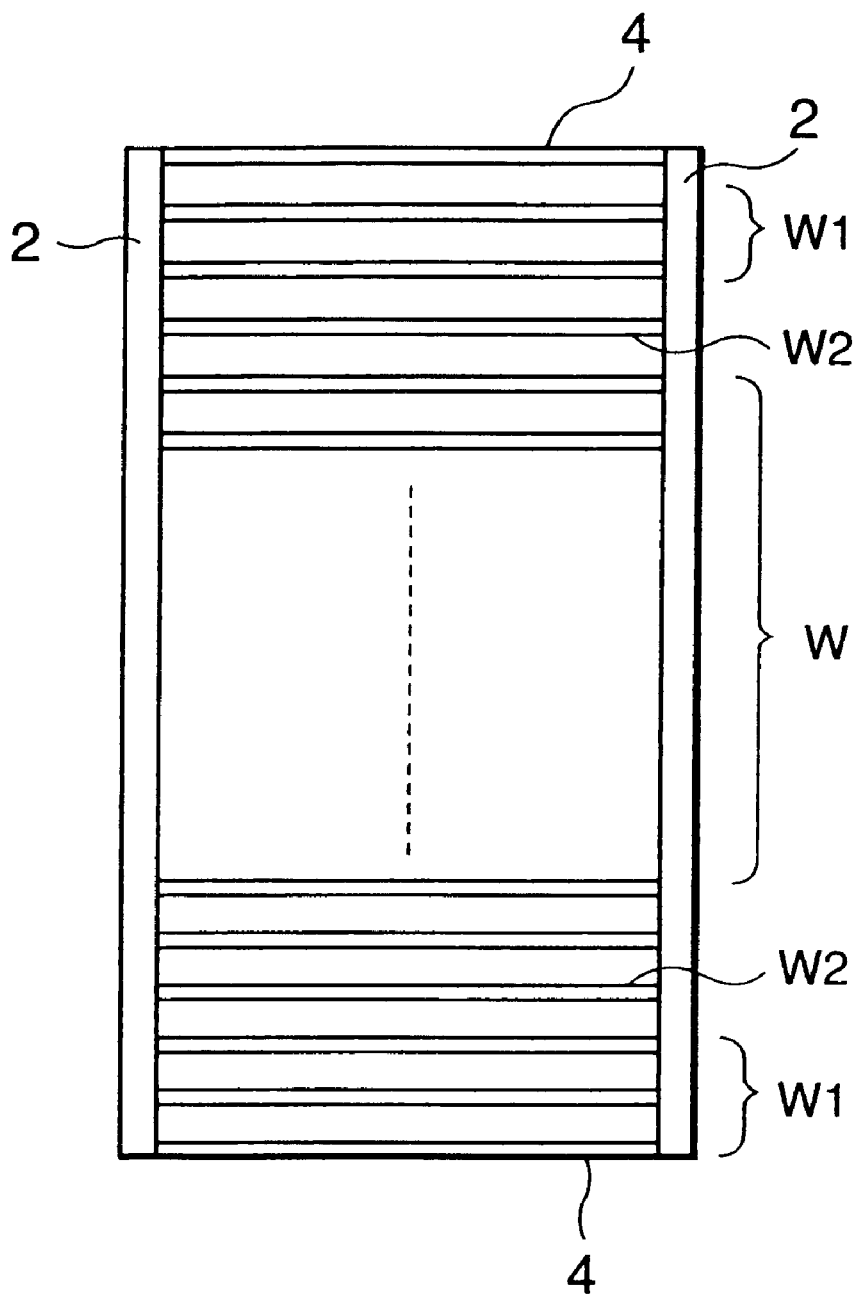
FIG. 11 is a general structural view of a wafer boat.

In the wafer boat 58 of this embodiment, circular film thickness equalization plates 60 made of a Material such as quartz are supported by grooves 12 formed at equal pitch in the three support columns 2 and are fixed integrally to each of the support columns 2 by fusing 62 (see FIG. 10). The film thickness equalization plates 60 are formed to be slightly larger than the wafers W and the same number of film thickness equalization plates 60 as the number of wafers W to be processed, such as a total of 50 to 150 plates. In addition, a plurality of hook-shaped support protrusions 14, such as three protrusions, are provided fixed to a peripheral edge portion of each film thickness equalization plate 60 so as to be disposed along a semicircular arc of the film thickness equalization plate 60. A peripheral edge portion of each wafer W is supported in contact with these support protrusions 14.

Figure 8:
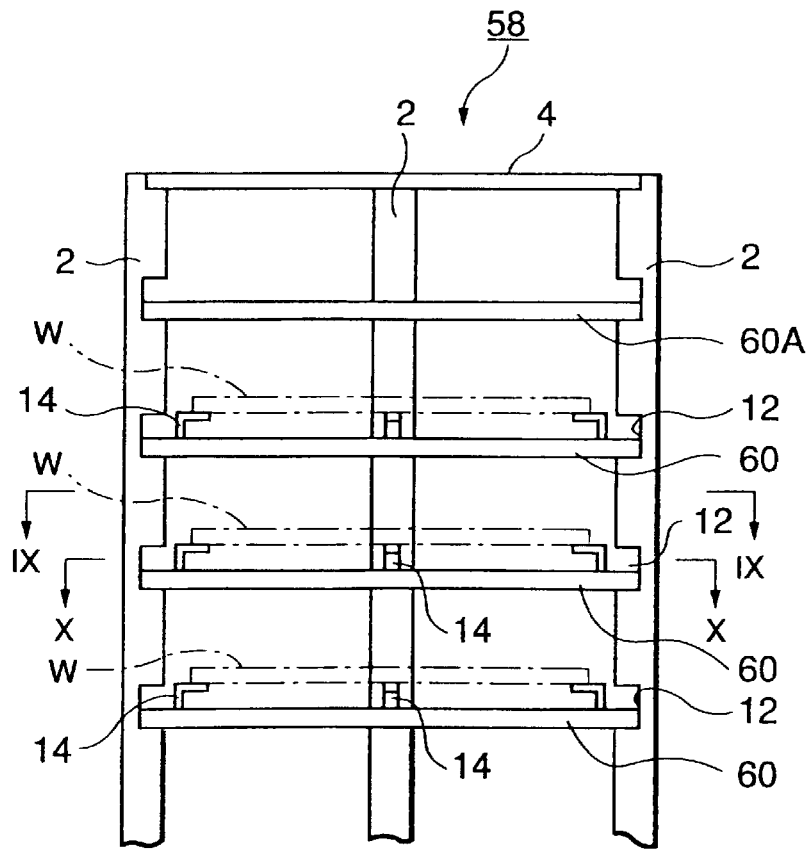
FIG. 8 is a partial enlarged front view of a second embodiment of the wafer boat in accordance with this invention.
Figure 9:
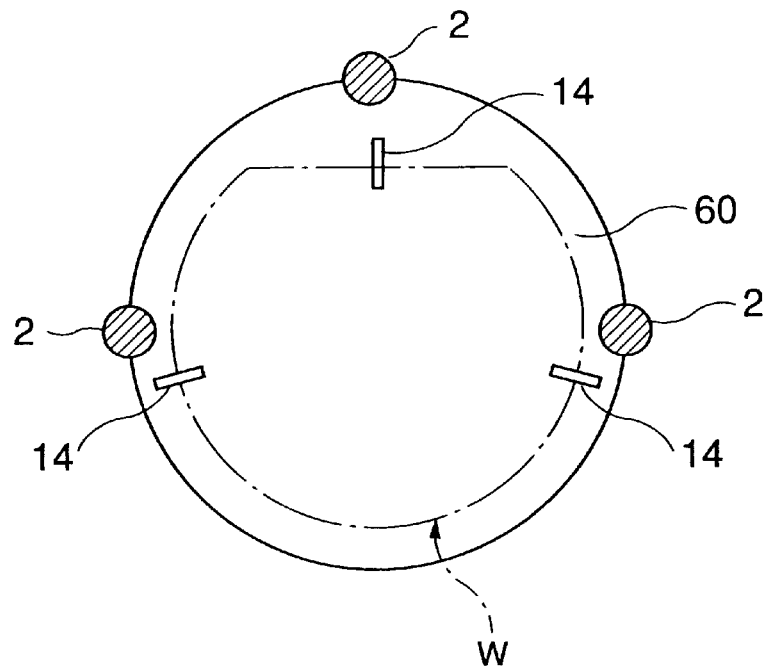
FIG. 9 is a cross-sectional view taken in the direction of the arrows IX—IX in FIG. 8.

The configuration of this embodiment is such that a film thickness equalization plate 60A that is positioned at the uppermost end, as shown in FIG. 8, is not provided with support protrusions and no wafer is mounted thereon.

In this case too, in a similar manner to that of the previously described embodiment, the upper surface of each wafer faces the lower surface of a film thickness equalization plate 60, in other words, the reverse surface thereof, during the film formation. Therefore it is possible to greatly improve the uniformity of the film thickness between different surfaces and within each surface.

Figure 14:
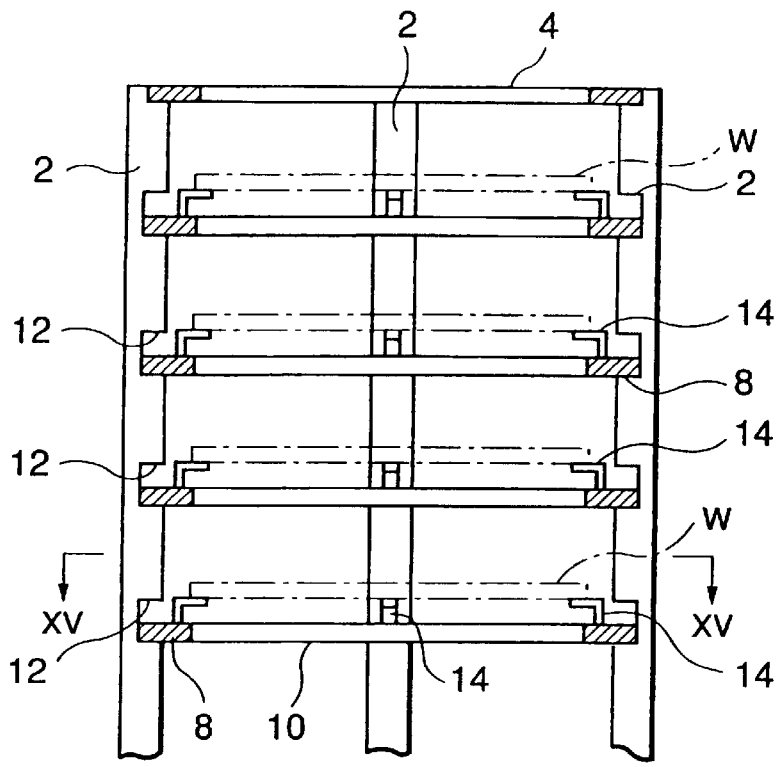
FIG. 14 is a partial enlarged view of another example of a prior-art wafer boat.
Figure 15:
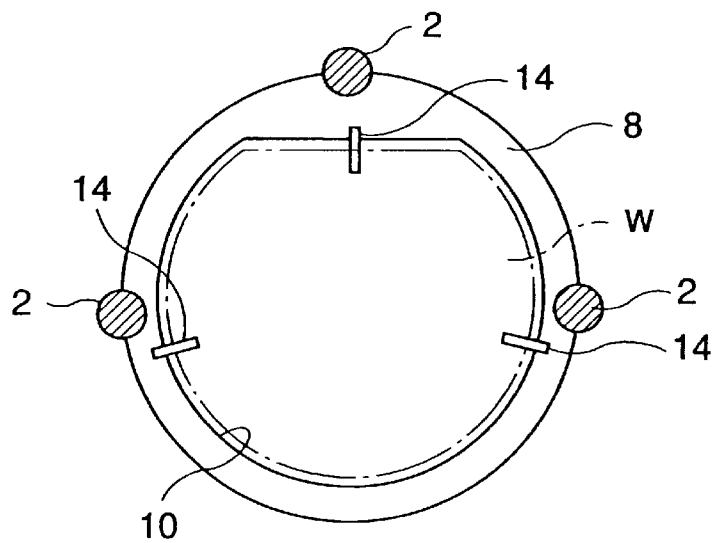
FIG. 15 is a cross-sectional view taken in the direction of the arrows XV—XV in FIG. 14.

Moreover, a circular plate can be used in this second embodiment instead of the known annular mounting stand that is shown in FIG. 14, which simplifies the manufacturing process and is also advantageous from the cost point of view.

Note that the above description relates to an example of forming a film of $Ta_2O_5$ by a surface reaction, but the present invention is not to be taken as being limited thereto. The principle of the present invention can of course be applied as appropriate to the formation of other types of film by surface reactions.

If the wafer boat of the present invention in accordance with the above description, the advantageous effects described below can be expected.

Since the provision of the film thickness equalization plate makes it possible to form films in such a manner that the same type of film faces the upper surface of each semiconductor wafer, which is the target of the film formation, it is possible to greatly improve the uniformity of the film thickness both within each wafer surface and between different wafer surfaces, without any of the effects due to differing film types. It is therefore possible to control the film thickness to a high level of accuracy, enabling the formation of thin films that are suitable for higher densities and higher integrations.

Figure 16:
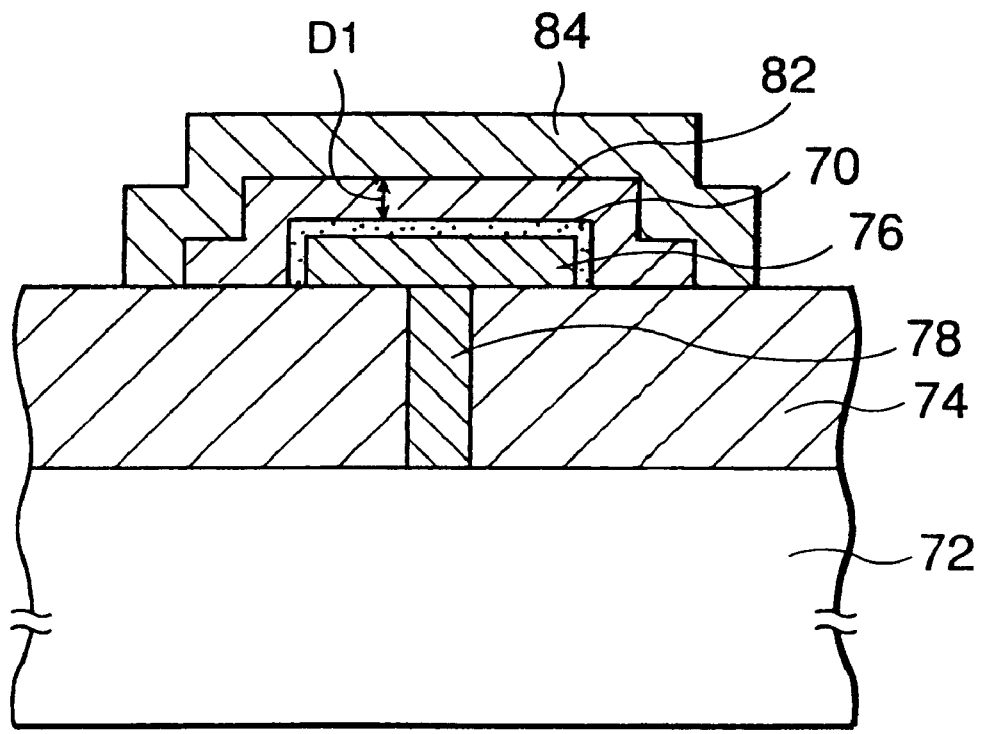
FIG. 16 is an enlarged cross-sectional view of the general configuration of a capacitor that is a semiconductor element.

As previously mentioned, tantalum oxide ($Ta_2O_5$) film has recently attracted attention as the capacitative insulating film for a capacitor. An example of the configuration of a capacitor in which this tantalum oxide film is used as a capacitative insulating film is shown in FIG. 16. In this example, reference number 72 denotes a semiconductor wafer which is the object to be processed, wherein either a surface thereof or the entire wafer has been doped with an impurity, and a lower electrode 76 is formed over an insulating film 74 of a material such as $SiO_2$. This lower electrode 76 is connected electrically to the semiconductor wafer 72 by a contact hole 78. The lower electrode 76 and the contact hole 78 are formed of a material such as polysilicon that has been doped with an impurity.

The surface of the lower electrode 76 is covered by a nitride (silicon nitride) film 70 formed by subjecting it to nitridation processing. This nitride film ,70 is provided to prevent oxidation of the polysilicon lower electrode 76 during the annealing that is performed after the tantalum oxide film has been formed, as will be described later.

A tantalum oxide film 82 that exhibits the function of a capacitative insulating film is then provided over this lower electrode 76, and an upper electrode 84 is formed thereover of a material such as a titanium nitride film, a tungsten film, or an aluminum film, to complete the structure of the capacitor.

Note that, since a tantalum oxide film has such a high dielectric constant, as mentioned above, it is extremely advantageous when used as the material of the capacitative insulating film, but it has disadvantages in that it is fairly difficult to control the film thickness and, in particular, the film thickness greatly depends on the time elapsed between the completion of the nitridation of the lower electrode surface in the previous processing step and the step of forming the tantalum oxide film.

Figure 17:
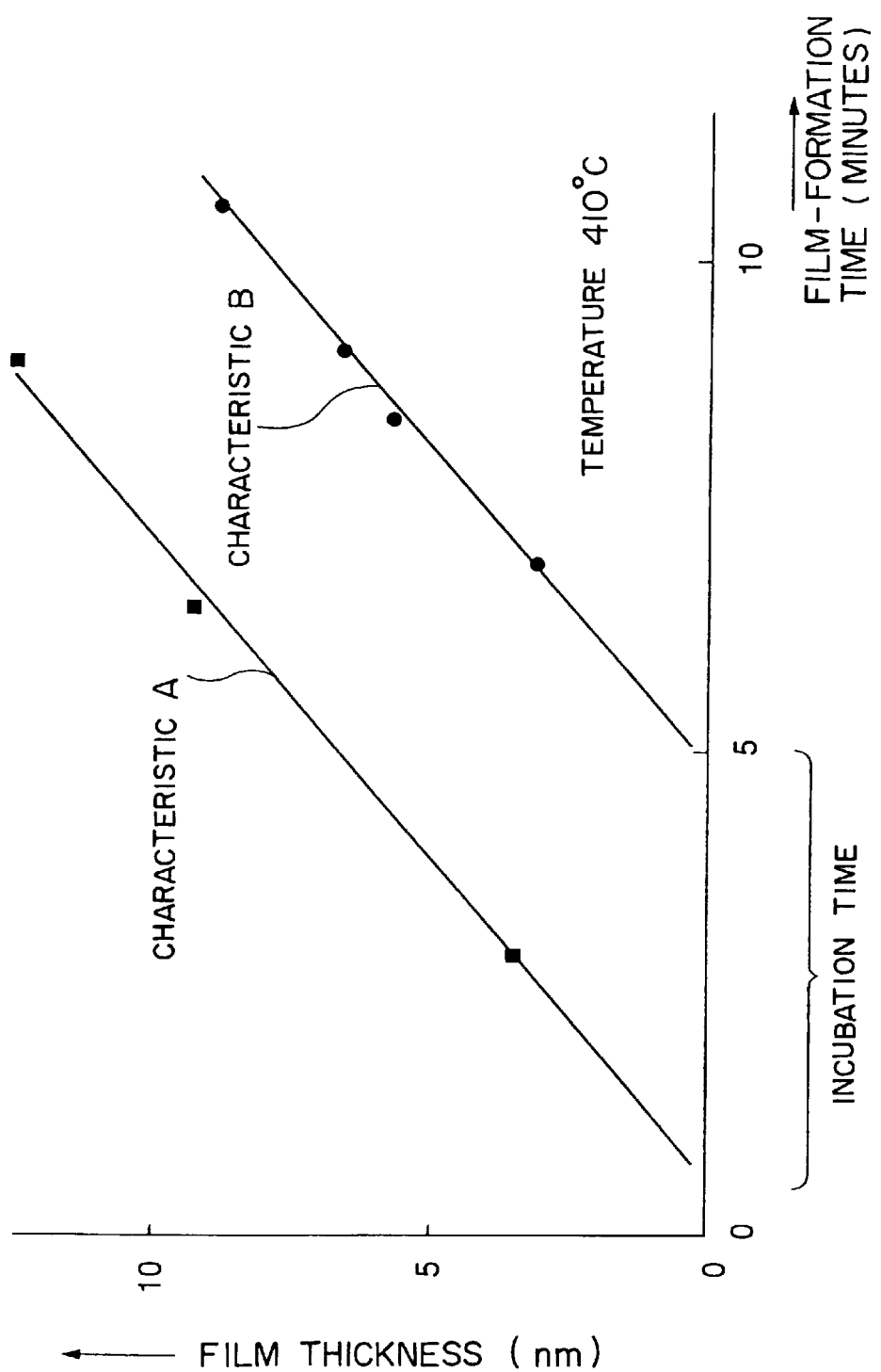
FIG. 17 is a graph of the relationship between $Ta_2O_5$ film thickness and film-formation time.

The relationship between $Ta_2O_5$ film thickness and film-formation time is shown graphically in. FIG. 17. In this graph, characteristic A shows the results obtained when the $Ta_2O_5$ film was formed immediately after the nitridation of the surface of the lower electrode and characteristic B shows the results obtained when the $Ta_2O_5$ film was formed after the wafer was left in a clean room for seven days after the nitridation of the surface of the lower electrode.

Note that this film formation was performed in a batch type of thermal CVD processing apparatus where the processing temperature was 410° C. As is clear from this graph, the film attached to the wafer immediately aster the start of the film-formation operation in the wafers represented by characteristic A, but there was a film-formation inactivity time (called the incubation time) of about five minutes after the start of the film-formation operation in the wafers represented by characteristic B, in the same manner as that shown in FIG. 6, before the film started to attach. This film-formation inactivity time tends to depend on the time elapsed after the end of the previous step, and thus it makes it difficult to control the film thickness to a high level of accuracy.

A particular problem relates to the way in which the thickness of the capacitative insulating film is currently set to a thickness close to the limit at which it can retain its insulating capabilities, as stated by the design rules for semiconductor devices, such as in the vicinity of several nm to several tens of nm, and control over the film thickness is required to be of a high level of accuracy. It is clear from FIG. 17 that even the slight difference of the five minutes' film-formation inactivity time could cause the film thickness to be only about 50% of the target film thickness.

Figure 18:
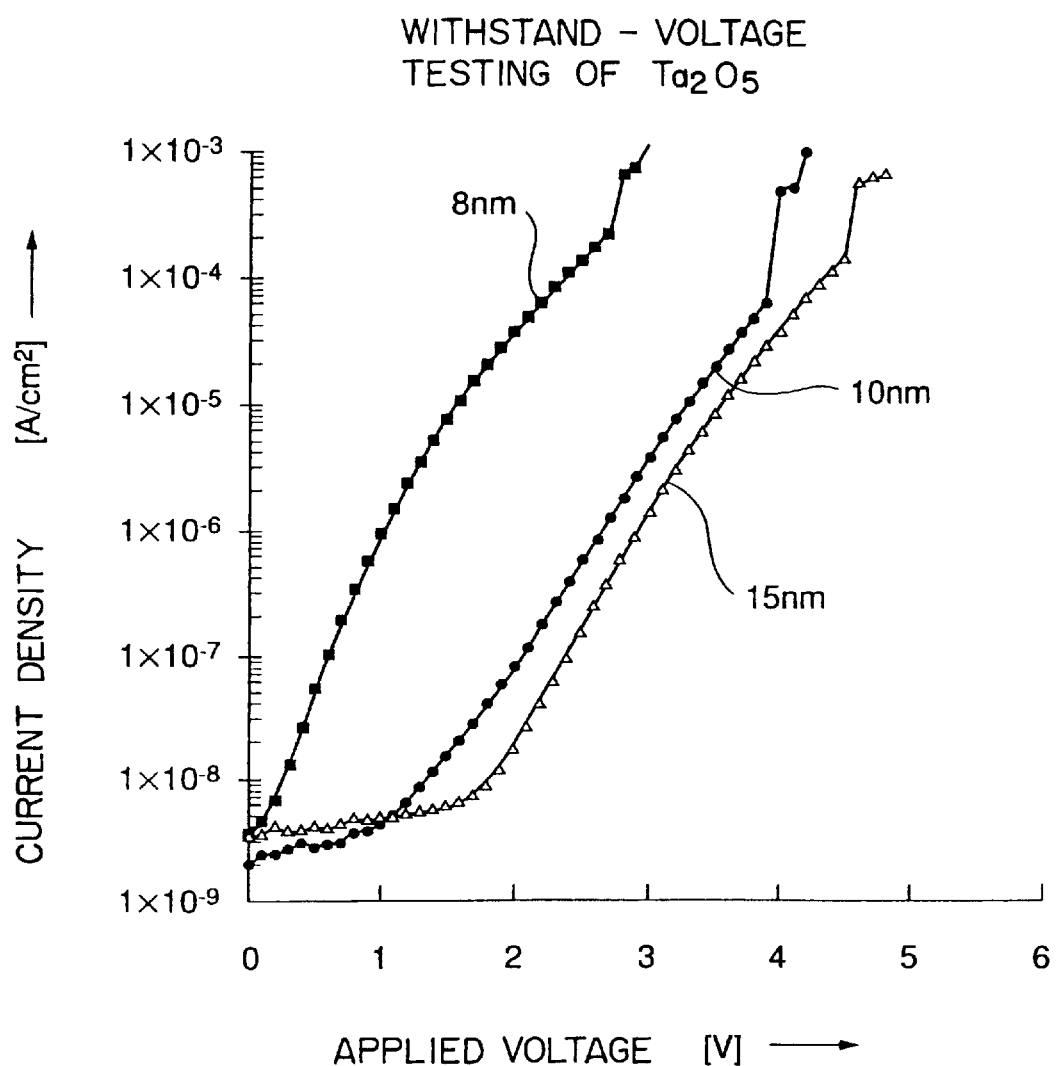
FIG. 18 is a graph of the relationship between applied voltage and current density when a $Ta_2O_5$ film is used as a capacitative insulating film for a capacitor.

The relationship between applied voltage and current density when $Ta_2O_5$ is used as the capacitative insulating film of a capacitor is shown in FIG. 18. If the film thickness is not more than approximately 10 nm, a small voltage causes a current to flow, so that the film does not function as a capacitative insulating film. Therefore, the above design rules cannot provide sufficient control under current rigorous conditions, irrespective of whether there are demands for control of the film thickness to a high level of accuracy on the order of nanometers.

In order to solve this problem, it has been considered to perform the process of forming the $Ta_2O_5$ film immediately after the nitridation of the lower electrode surface has been completed, without allowing the above amount of time to elapse. However, since the film-formation processing is generally performed by batch processing that starts when a certain number of wafers, such as 50 wafers, have accumulated, but this cannot be done at present because there are usually variations in the waiting time after the previous process has ended. Even when single-wafer processing is used, there are various other reasons why it is usually not possible to always move on to the $Ta_2O_5$ film-formation processing immediately after the previous step has ended.

This problem can be solved by the film-formation method that will be described below.

Steps used for illustrating this film-formation method are shown in FIGS. 19(A) to 19(E). In this case, the figures illustrate the formation of a tantalum oxide ($Ta_2O_5$) film as a capacitative insulating film for a capacitor. Note that this film-formation method can also be used for forming films of high-dielectric-constant materials other than tantalum oxide films.

Figure 19A:
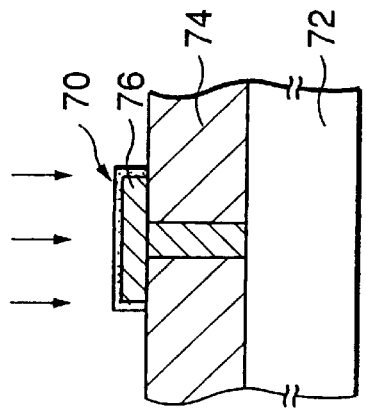
FIGS. 19(A) to 19(E) show processing steps illustrating a film-formation method that can be performed by using the wafer boat of this invention.

In FIG. 19(A), reference number 72 denotes a semiconductor wafer 72 of silicon which is the object to be processed, wherein either a surface thereof or the entire wafer has been doped with an impurity, and an insulating film 74 of a material such as $SiO_2$ is formed on the surface thereof. A lower electrode 76 is formed by patterning over the insulating film 74, and the lower electrode 76 is connected electrically to the conductor side of the semiconductor wafer 72 by a contact hole 78. The lower electrode 76 and the contact hole 78 are formed of a material such as polysilicon that has been doped with an impurity. Note that tungsten (W), ruthenium (Ru), ruthenium oxide (RuO$_2$), or platinum (Pt) could be used instead of polysilicon in this case.

Figure 19B:
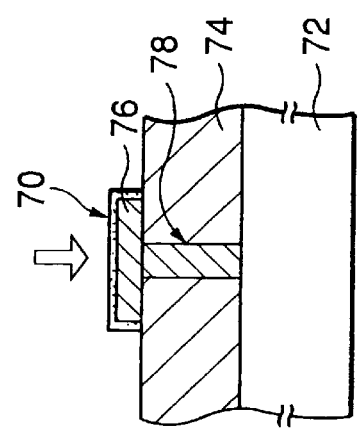

The thus configured lower electrode 76 is first covered by the nitride (silicon nitride) film 70, as shown in FIG. 19(B), by subjecting the surface thereof i:o high-speed nitriding by annealing at a predetermined temperature, such as between approximately 700° C. to 900° C., in an NH$_3$ atmosphere within a furnace. The reason why the lower electrode 76 is covered by the nitride film 70 in this manner is to prevent any deterioration in the dielectric constant of the complete capacitor caused by oxidation of the polysilicon lower electrode 76, which could happen during the annealing in an oxygen environment that occurs after the tantalum oxide film has been formed, as will be described later.

Figure 19C:
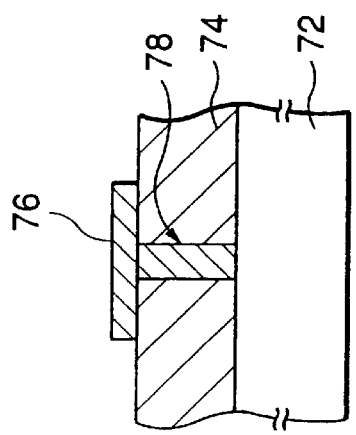

The wafer 72 is then subjected to organic-substance removal washing immediately before the tantalum oxide film is formed on the wafer surface as a capacitative insulating film, as shown in FIG. 19(C), to remove any organic substances adhering to the wafer surface. These organic substances are comprised within the washing environment of the clean room and attached to the surface of the nitride film 70 when the wafer is exposed within the clean room after the nitriding. They have various sources, such as structural materials, as will be discussed later.

This organic-substance removal washing may be either a wet wash that uses a washing liquid or a dry wash that does not use it. For a wet wash, a sulfuric acid peroxide mixture (SPM) wash using a mixture of hydrogen peroxide (H$_2$O$_2$) and sulfuric acid (H$_2$SO$_4$), an HF wash using a washing liquid fabricated by dissolving hydrogen fluoride (HF) gas in distilled water, or an ammonia peroxide mixture (APM) wash using a washing liquid fabricated by dissolving hydrogen peroxide (H$_2$O$_2$) and ammonium (NH$_4$OH) in distilled water could be used. The washing could be done by immersing the entire wafer in the above washing liquid for between about one minute and ten minutes, for example. Note that a method that employs steam from such a washing liquid could also be used.

A dry wash could be an ultra-violet wash that disassociates organic substances by shining ultra-violet light onto the wafer surface, either in the presence of ozone or without ozone, or an annealing wash that subjects the wafer surface to a thermal treatment in an oxygen or ozone environment to oxidize the organic substances.

Figure 19D:
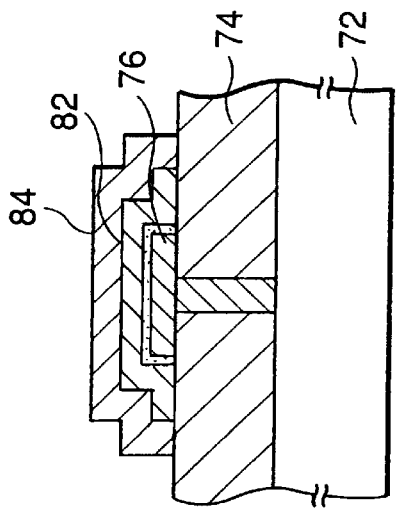

Once this organic-substance removal washing is completed, the operation for forming the capacitative insulating film is performed immediately to form the tantalum oxide film 82, as shown in FIG. 19(D), using the above described wafer boat. The time elapsed between the completion of the organic-substance removal washing and the start of the film-formation operation should be as short as possible, but if the target film thickness is on the order of several nm to several tens of nm this is a maximum of about 48 hours. If the wafers are allowed to rest for any longer, the film-formation inactivity time will increase and an error in the film thickness in excess of the permitted quantity will occur.

A batch type of CVD film-formation process in a vertical thermal processing furnace may be used during this film formation, or a single-wafer type of film-formation process by sputtering PVD using a plasma film-formation apparatus or thermal CVD using a CVD film-formation apparatus may be used therefor. In this embodiment, the tantalum oxide film 82 is formed by a batch type of CVD apparatus.

The processing conditions could be a processing temperature within a range of 350° C. to 500° C., for example; a processing pressure within a range of 0.05 Torr to 10 Torr, for example; penta-ethoxy tantalum and oxygen are supplied as film-formation gases where the flow-rates thereof are within the ranges of 0.01 sccm to 1.0 sccm and 10 sccm to 5000 sccm, for example; and an inert gas such as N$_2$, He, or Ar is used as a carrier gas with a flow-rate within the range of 100 sccm to 2000 sccm, for example.

Once the patterned tantalum oxide film 82 has been formed in this manner, it is annealed in an oxygen atmosphere at a predetermined temperature, such as between 600 and 800° C.

Figure 19E:
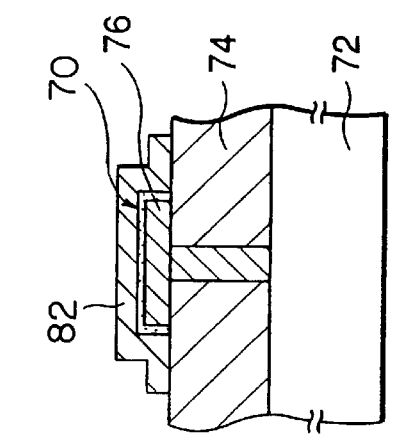

The upper electrode 84, consisting of alternating layers of titanium nitride and tungsten, for example, is then formed and patterned to cover the tantalum oxide film 82 as shown in FIG. 19(E). This completes the capacitor element.

The above described removal of any organic substances that have adhered to the nitride film 70 before the tantalum oxide film 82 is formed has the effect that there is substantially no occurrence of the film-formation inactivity time shown in FIG. 17 at the start of the adhesion of the film, from immediately after the start of the film-formation operation for the tantalum oxide film 82. This means that the thickness of this tantalum oxide film can be controlled highly accurately in nanometer units by managing the film-processing time.

Figure 20B:
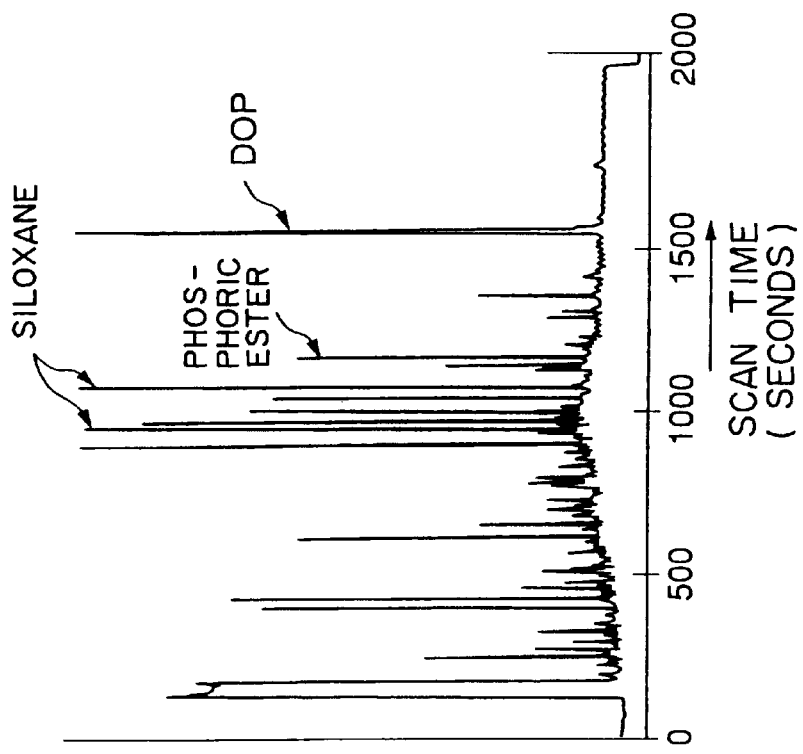
FIGS. 20(A) and 20(B) are graphs of the effects of organic-substance removal washing.
Figure 20A:
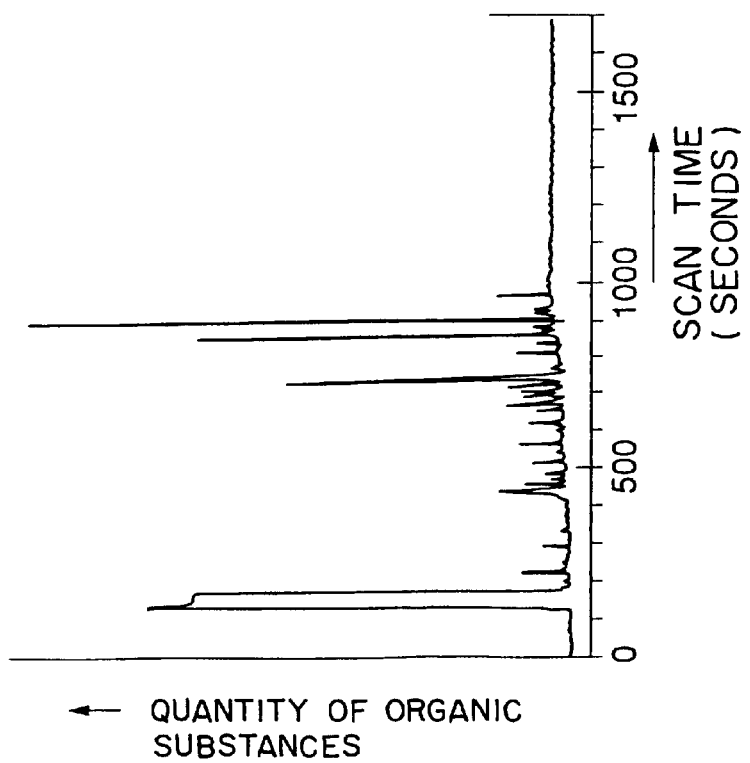

The effects of organic-substance removal washing are shown graphically in FIGS. 20(A) and 20(B). FIG. 20(A) shows the organic components of a surface immediately after RTN processing and FIG. 20(B) shows the organic components of a surface that has been left in the clean room for three days after RTN processing.

GC-Mass, which is a type of gas chromatography, was used in the measurements of these organic components. It is clear from these graphs that a large number of organic components can be discerned in the graph of FIG. 20(B), and the adhering of large quantities of substances such as dioctyl phthalate (DOP), phosphoric ester, and siloxane in particular can be identified. These organic components are components such as additives used in the structural materials or HEPA filters of the clean room, flame retardants, plasticizers for preventing cracking in plastics, and oxidation-prevention agents. The result of removing these organic components before forming the Ta$_2$O$_5$ film enables control over the film thickness with better accuracy.

Any composition ratio of the various washing liquids in the above wet washing can be used, but for SPM washing, for example, useful results are exhibited when the ratio of H$_2$O$_2$ to H$_2$SO$_4$ is 1:4 and when it is 1:9, and the Ta$_2$O$_5$ film starts to adhere immediately after the start of the film-formation operation. The temperature of the washing liquid during this time was found to have substantially no effect on the washing characteristics thereof. Note that the washing liquid for SPM washing could equally well be H$_2$O$_2$ alone.

When washing liquid with a composition ratio of distilled water to H$_2$O$_2$ to NH$_4$OH of 10:1:1 or 10:1:0.5 was used for APM washing, both examples exhibited useful effects that were similar to that of the above SPM washing.

When washing liquid consisting of a solution of approximately 0.25% HF gas dissolved in distilled water was sued for HF washing, useful effects that were similar to that of the above SPM washing were obtained.

For dry washing with ultra-violet light, an excimer lamp that emits large quantities of ultra-violet light at a wavelength of approximately 172 nm was used and washing was continued for approximately ten minutes in an air environment and in an air environment in which ozone was supplied. Both examples exhibited useful effects that were similar to that of the above SPM washing.

For annealing washing, annealing was performed in both an $O_2$ environment and an $O_3$ environment at temperatures of 200 to 400° C. and for five to ten minutes. Both examples exhibited useful effects that were similar to that of the above SPM washing.

Figure 21:
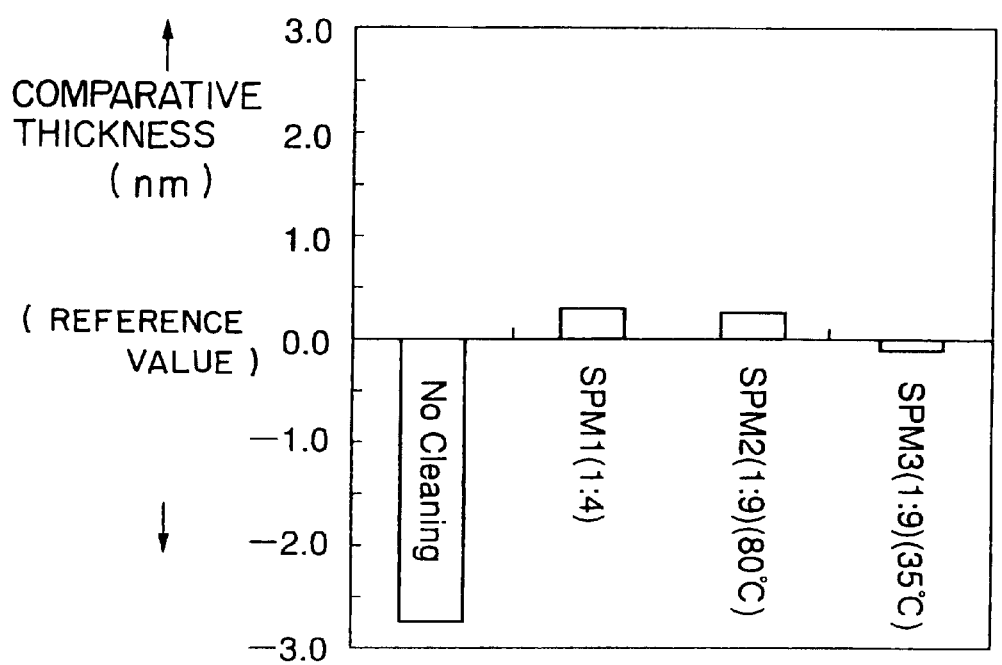
FIG. 21 is a graph of the effects obtained when SPM washing is performed.

The results obtained when SPM washing was performed are shown in FIG. 21. The film thickness of 10 nm obtained when the $Ta_2O_5$ film formation operation was started immediately after the RTN processing of the under-film (lower electrode) was taken as a reference value. In this figure, "No Cleaning" shows the result obtained for the formation of a $Ta_2O_5$ film when the wafer was left for three days in the clean room and was not washed, SPM1 shows the result obtained by using a washing liquid of $H_2O_2$ to $H_2SO_4$ in a ratio of 1:4, SPM2 shows the result obtained by using a washing liquid of $H_2O_2$ to $H_2SO_4$ in a ratio of 1:9 at a temperature of 80° C., and SPM3 shows the result obtained by using a washing liquid of $H_2O_2$ to $H_2SO_4$ in a ratio of 1:9 at a temperature of 35° C. Note that the film-formation operation time was, of course, the same in all cases. It is clear from the figure that the "No Cleaning" case resulted in a film thickness that was approximately 3 nm lower than the reference value (10 nm ). This is 30% less than the reference value of 10 nm , which is outside the permissible range for a product. In contrast thereto, all of the other cases SPM1 to SPM3 were within the range of 0.5 nm from the reference value, which is clearly a favorable result.

The above description took as an example the formation of a capacitative insulating film for a capacitor, but it should be obvious to those in the art that this film-formation method is not limited thereto and it can equally well be applied to all film-formation operations in which a large film-formation inactivity time occurs at the start of formation of a film.

Similarly, the object to be processed is not limited to a semiconductor wafer; it can equally well be a glass substrate or an LCD board.

The film-formation method of this present invention makes it possible to achieve the superior effects described below.

Since any organic substances that may have adhered to the surface of the object to be processed are removed by the organic-substance removal washing that is performed immediately before the film formation, the film can be made to adhere to the surface immediately after the start of the film-formation operation and thus the length of the film-formation inactivity time can be greatly reduced. This means that the thickness of the thus-formed film can be controlled with good accuracy on the order of nanometers. In particular, when a tantalum oxide film is formed to act as a capacitative insulating film for a capacitor, performing the organic-substance removal washing immediately before this film formation makes it possible to form a film with a suitable film thickness, which makes it possible to form a film that is ideal for higher levels of integration and miniaturization.

What is claimed is:

1. A wafer boat for supporting a plurality of semiconductor wafers parallel and at spacings, to be subjected to a thermal treatment in a vertical thermal treatment furnace, said wafer boat comprising:

a plurality of parallel support columns;

wafer support means formed at intervals in a longitudinal direction of said support columns at positions along said support columns, for supporting peripheral portions of said wafers; and a film thickness equalization plate provided to be at least substantially the same size as said wafers and positioned between two of said wafer support means that are adjacent in the longitudinal direction of said support columns.

2. The wafer boat as defined in claim 1, wherein said wafer support means comprises wafer support grooves formed in said support columns.

3. The wafer boat as defined in claim 1, wherein said film thickness equalization plate is connected to said support columns.

4. The wafer boat as defined in claim 1, wherein said film thickness equalization plate is formed of quartz.

5. The wafer boat as defined in claim 1, wherein said film thickness equalization plate is supported on said support columns and said wafer support means is provided on said film thickness equalization plate.

6. The wafer boat as defined in claim 5, wherein said film thickness equalization plate is supported on said support columns by support means.

7. The wafer boat as defined in claim 6, wherein said support means of said film thickness equalization plate comprises grooves formed in said support columns.

8. The wafer boat as defined in claim 5, wherein said wafer support means is formed of support protrusions protruding from the surface of said film thickness equalization plate.

* * * * *